United States Patent
Yang et al.

(10) Patent No.: US 10,289,766 B2
(45) Date of Patent: May 14, 2019

(54) METHOD AND APPARATUS FOR CONSTRUCTING TEST SCENARIO OF UNMANNED VEHICLES

(71) Applicant: BAIDU ONLINE NETWORK TECHNOLOGY (BEIJING) CO., LTD., Beijing (CN)

(72) Inventors: Wenli Yang, Beijing (CN); Tianlei Zhang, Beijing (CN); Yuchang Pan, Beijing (CN); Haowen Sun, Beijing (CN)

(73) Assignee: BAIDU ONLINE NETWORK TECHNOLOGY (BEIJING) CO., LTD., Beijing (CN)

( * ) Notice: Subject to any disclaimer, the term of this patent is extended or adjusted under 35 U.S.C. 154(b) by 280 days.

(21) Appl. No.: 15/276,775

(22) Filed: Sep. 26, 2016

(65) Prior Publication Data
US 2017/0371986 A1    Dec. 28, 2017

(30) Foreign Application Priority Data
Jun. 27, 2016    (CN) .......................... 2016 1 0482411

(51) Int. Cl.
*G06G 7/48*    (2006.01)
*G06F 17/50*    (2006.01)

(52) U.S. Cl.
CPC ...... *G06F 17/5009* (2013.01); *G06F 17/5095* (2013.01); *G06F 2217/14* (2013.01)

(58) Field of Classification Search
None
See application file for complete search history.

(56) References Cited

U.S. PATENT DOCUMENTS

| | | | |
|---|---|---|---|
| 5,001,635 A | 3/1991 | Yasutomi et al. | |
| 9,606,539 B1 * | 3/2017 | Kentley | G05D 1/0214 |
| 9,612,123 B1 * | 4/2017 | Levinson | G01C 21/32 |
| 9,632,502 B1 * | 4/2017 | Levinson | G05D 1/0027 |
| 9,720,415 B2 * | 8/2017 | Levinson | G01S 17/42 |
| 2005/0202861 A1 * | 9/2005 | Dougherty | A63F 13/10 463/1 |
| 2014/0136414 A1 * | 5/2014 | Abhyanker | G06Q 50/28 705/44 |
| 2015/0254986 A1 * | 9/2015 | Fairfield | G08G 1/22 707/687 |

(Continued)

FOREIGN PATENT DOCUMENTS

| | | |
|---|---|---|
| CN | 103207090 A | 7/2013 |
| CN | 103234763 A | 8/2013 |

(Continued)

OTHER PUBLICATIONS

Tomas et al Agent-based test-bed for road information systems IET Intelligent Transport Systems, 2012, vol. 6, Iss. 4, pp. 404-412.*

(Continued)

*Primary Examiner* — Aniss Chad
*Assistant Examiner* — Cuong V Luu
(74) *Attorney, Agent, or Firm* — Ladas & Parry, LLP

(57) ABSTRACT

The present invention discloses a method and an apparatus of constructing a test scenario of an unmanned vehicle. The method comprises: obtaining a scenario attribute set by the user; respectively determining a map and an agent matching with the scenario attribute; generating a test scenario according to the determined map and agent. The solution of the present invention can be used to improve the efficiency of constructing the test scenario.

15 Claims, 1 Drawing Sheet

(56) References Cited

U.S. PATENT DOCUMENTS

| | | | |
|---|---|---|---|
| 2016/0036558 A1* | 2/2016 | Ibrahim | H04L 67/18 |
| | | | 455/297 |
| 2017/0123429 A1* | 5/2017 | Levinson | G05D 1/0088 |
| 2017/0124476 A1* | 5/2017 | Levinson | G05D 1/0088 |
| 2017/0124781 A1* | 5/2017 | Douillard | B60Q 1/26 |
| 2017/0132334 A1* | 5/2017 | Levinson | G06F 17/5009 |
| 2017/0132934 A1* | 5/2017 | Kentley | G08G 1/202 |
| 2017/0161410 A1* | 6/2017 | Mizuta | G06F 17/5009 |
| 2018/0136651 A1* | 5/2018 | Levinson | G05D 1/0044 |

FOREIGN PATENT DOCUMENTS

| | | |
|---|---|---|
| CN | 103335353 A | 10/2013 |
| CN | 103852264 A | 6/2014 |

OTHER PUBLICATIONS

Zhang et al. City Traffic Simulator Using Geographical Information Systems and Agent-Based Simulation 3rd IET International Conference on Intelligent Environment, Sep. 2007.*

From CN 201610482411.8, First Office Action, dated Feb. 13, 2017, with English translation from Global Dossier.

From CN 201610482411.8, Chinese Search Report, dated Feb. 3, 2017, with English translation from Global Dossier.

From CN 201610482411.8, Notification of Re-examination, dated May 29, 2018, with machine English translation from Google.

From CN 201610482411.8, Decision of Re-examination, dated Nov. 6, 2018 with machine translation from Google.

From CN 201610482411.8, Decision of Rejection, dated May 10, 2018, with machine English translation from Google.

* cited by examiner

METHOD AND APPARATUS FOR CONSTRUCTING TEST SCENARIO OF UNMANNED VEHICLES

CROSS-REFERENCE TO RELATED APPLICATION

This application claims the priority to and the benefit of Chinese Patent Application No. CN201610482411.8 filed on Jun. 27, 2016, the disclosure of which is incorporated herein by reference in its entirety.

FIELD OF THE INVENTION

The present invention relates to unmanned driving technologies, and particularly to a method and apparatus for constructing a test scenario of an unmanned vehicle.

BACKGROUND OF THE INVENTION

During research and development of unmanned vehicles, a lot of real scenarios are needed to test correctness of algorithm.

However, if all tests are performed in real traffic scenarios, it is very dangerous and less efficient, so it is necessary to construct a simulated test scenario in place of the real traffic scenario to complete many preliminary tests.

To simulate real traffic scenario, the constructed test scenario needs to include, besides map, various agents such as pedestrians, bicycles, cars and buses.

In the prior art, construction of the test scenario is mainly implemented by manual operation, e.g., manually look up maps and agents to construct the test scenario, with a very low construction efficiency.

SUMMARY OF THE INVENTION

The present invention provides a method and apparatus for constructing a test scenario of an unmanned vehicle, which can improve a construction efficiency of the test scenario.

Specific technical solutions are as follows:

A method of constructing a test scenario of an unmanned vehicle, comprising:

obtaining a scenario attribute set by the user;

respectively determining a map and an agent matching with the scenario attribute;

generating a test scenario according to the determined map and agent.

According to a preferred embodiment of the present invention,

Before respectively determining a map and an agent matching with the scenario attribute, the method further comprises:

obtaining an alternative map repository and an alternative agent repository;

the respectively determining a map and an agent matching with the scenario attribute comprises:

determining from the alternative map repository a map matching with the scenario attribute; and determining from the alternative agent repository an agent matching with the scenario attribute.

According to a preferred embodiment of the present invention,

The obtaining an alternative map repository and an alternative agent repository comprises:

regarding all maps in the pre-generated map management repository as alternative maps to form the alternative map repository;

regarding all agents in the pre-generated agent management repository as alternative agents to form the alternative agent repository;

or, regarding maps screened out from the map management repository and related to the scenario attribute as alternative maps to form the alternative map repository;

regarding agents screened out from the agent management repository and related to the scenario attribute as alternative agents to form the alternative agent repository.

According to a preferred embodiment of the present invention, the generating a test scenario according to the determined map and agent comprises:

when the number of the determined maps is one, fusing the determined map with the determined agent to obtain the test scenario;

when the number of the determined maps is greater than one, fusing each determined map with the determined agent to obtain a fused scenario, and then regarding a fused scenario best matching with the scenario attribute as the test scenario.

According to a preferred embodiment of the present invention, the determining from the alternative map repository a map matching with the scenario attribute comprises:

respectively determining a fitting degree between the alternative map in the alternative map repository and the scenario attribute, and regarding N alternative maps with a maximum fitting degree as maps matching with the scenario attributes, N being a positive integer.

According to a preferred embodiment of the present invention, the determining from the alternative agent repository an agent matching with the scenario attribute comprises:

determining classes of agents corresponding to the scenario attribute and the number of agents under each class according to agent setting situations respectively corresponding to different pre-set scenario attributes, and selecting agents from the alternative agent repository according to the determined classes of agents and the number of agents under each class.

According to a preferred embodiment of the present invention,

The method further comprises:

receiving and storing the user's adjustment of the test scenario.

An apparatus of constructing a test scenario of an unmanned vehicle comprises: an obtaining unit, a determining unit and a constructing unit;

the obtaining unit is configured to obtain a user-set scenario attribute, and transmit the scenario attribute to the determining unit;

the determining unit is configured to respectively determine a map and agent matching with the scenario attribute, and transmit the determined map and agent to the constructing unit;

the constructing unit is configured to generate a test scenario according to the determined map and agent.

According to a preferred embodiment of the present invention, the obtaining unit is further configured to, after obtaining the scenario attribute, obtain an alternative map repository and an alternative agent repository, and transmit the obtained alternative map repository and alternative agent repository to the determining unit;

the determining unit is configured to determine from the alternative map repository a map matching with the scenario attribute, and determine from the alternative agent repository an agent matching with the scenario attribute.

According to a preferred embodiment of the present invention, the alternative map repository is formed by all maps in the pre-generated map management repository;

the alternative agent repository is formed by all agents in the pre-generated agent management repository;

or, the alternative map repository is formed by maps screened out from the map management repository and related to the scenario attribute;

the alternative agent repository is formed by agents screened out from the agent management repository and related to the scenario attribute.

According to a preferred embodiment of the present invention, the obtaining unit is further configured to transmit the scenario attribute to the constructing unit;

when the number of the determined maps is one, the constructing unit directly fuses the determined map with the determined agent to obtain the test scenario;

when the number of the determined maps is greater than one, the constructing unit is configured to fuse each determined map with the determined agent to obtain a fused scenario, and then regard a fused scenario best matching with the scenario attribute as the test scenario.

According to a preferred embodiment of the present invention, the determining unit is configured to respectively determine a fitting degree between the alternative map in the alternative map repository and the scenario attribute, and regard N alternative maps with a maximum fitting degree as maps matching with the scenario attributes, N being a positive integer.

According to a preferred embodiment of the present invention, the determining unit is configured to determine classes of agents corresponding to the scenario attribute and the number of agents under each class according to agent setting situations respectively corresponding to different pre-set scenario attributes, and select agents from the alternative agent repository according to the determined classes of agents and the number of agents under each class.

According to a preferred embodiment of the present invention, the constructing unit is further configured to receive and store the user's adjustment of the test scenario.

As can be seen from the above depictions, with the solution of the present invention being employed, the map and agent matching with the scenario attribute may be automatically screened according to the user-set scenario attribute and thereby the test scenario is generated. As compared with the prior art, the solution of the present invention improves the construction efficiency of the test scenario and thereby shortens a test cycle of the unmanned vehicle.

DETAILED DESCRIPTION OF PREFERRED EMBODIMENTS

In view of problems existing in the prior art, the present invention provides a solution for constructing a test scenario of an unmanned vehicle, which can improve the construction efficiency of the test scenario.

The solutions of the present invention will be described in detail in conjunction with figures and embodiments to make technical solutions of the present invention clearer and more apparent.

Embodiment 1

Figure 1:
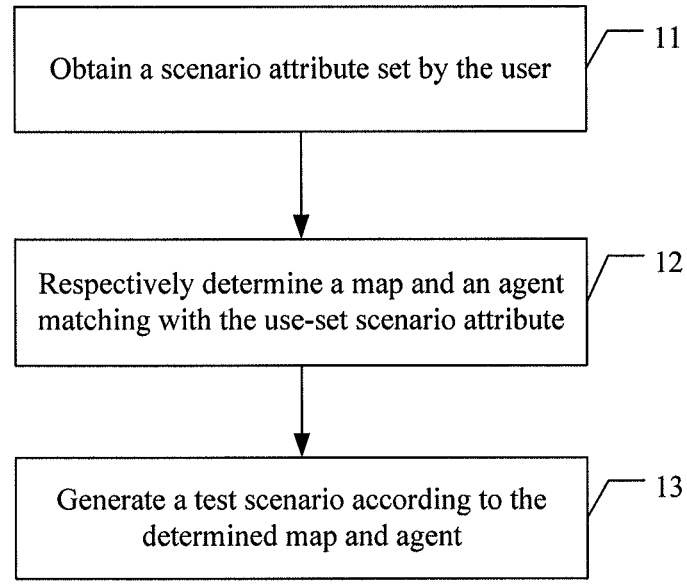
FIG. 1 is a flow chart of an embodiment of a method of constructing a test scenario of an unmanned vehicle according to the present invention.

FIG. 1 is a flow chart of an embodiment of a method of constructing a test scenario of an unmanned vehicle according to the present invention. As shown in FIG. 1, the method comprises the following specific implementation modes.

In step 11, obtain a scenario attribute set by the user.

The user-set scenario attribute may comprise road style, congestion degree, agent behavior attribute and the like, wherein road style may refer to road type such as urban road or super highway, number and width of lanes and the like. The agent behavior attribute may refer to normal walk, traversing or the like. Specific content included in the scenario attribute may be determined according to actual needs.

In step 12, respectively determine a map and agent matching with the user-set scenario attribute.

After obtaining the user-set scenario attribute, the method may further comprise obtaining an alternative map repository and an alternative agent repository, determining from the alternative map repository a map matching with the user-set scenario attribute, and determining from the alternative agent repository an agent matching with the user-set scenario attribute.

In practical application, it is feasible to pre-store in one map management repository all maps that may be used for generating test scenarios. How to generate maps in the map management repository is of the prior art. It is feasible to pre-store in one agent management repository all agents that might be used for generating test scenarios. How to generate agents in the agent management repository is also of the prior art.

Maps stored in the map management repository all are high-precision maps. As compared with ordinary maps, high-precision maps have richer map information such as lane lines, lane boundary, zebra crossing, stop lines, traffic lights, traffic signs and the likes.

The agent has its own trigger condition and disappearance condition, meanwhile has a specific traffic behavior and can be perfectly fused with the high-precision map.

The map management repository may support addition, deletion, lookup and modification of maps therein, and the agent management repository may support addition, deletion, lookup, and modification of agents therein.

All maps in the map management repository may be regarded as alternative maps to form the alternative map repository. All agents in the agent management repository may be regarded as alternative agents to form the alternative agent repository.

Alternatively, to reduce the workload in subsequent processing, maps screened out from the map management repository and related to the user-set scenario attribute may be regarded as alternative maps to form the alternative map repository, and agents screened out from the agent management repository and related to the user-set scenario attribute may be regarded as alternative agents to form the alternative agent repository.

Screening may be performed manually, for example, the road type in the scenario attribute is super highway. Since bicycles do not appear on the super highway, agents in the class of bicycles needn't be added to the alternative agent repository.

Maps in the map management repository have their respective tags. The tags may include style tags and attribute tags. The style tags may employ a hierarchical representation manner such as urban road-straight road crossing. The attribute tags are used to describe map attributes, such as the number and width of lanes. Similarly, agents in the agent management repository have their respective tags. The tags include style tags such as pedestrian-normal walk and attribute tags and the like.

As for each alternative map in the alternative map repository, a fitting degree between the alternative map and the user-set scenario attribute may be determined according to the tag of the alternative map, and N alternative maps with a maximum fitting degree may be regarded as maps matching with the user-set scenario attributes.

As stated above, the user-set scenario attribute may include road style. The road style may be road type such as urban road or super highway, number and width of lanes and the like. The fitting degree between the alternative map and the user-set scenario attribute may be determined very conveniently according to tag information of alternative maps.

The aforesaid N is a positive integer. A specific value thereof may be decided according to actual needs, for example, it may be one or greater than one.

Regarding the alternative map repository, classes of agents corresponding to the user-set scenario attribute and the number of agents under each class may be determined according to agent setting situations respectively corresponding to different pre-set scenario attributes, and agents may be selected from the alternative agent repository according to the determined classes of agents and the number of agents under each class.

For example, it is feasible to pre-set agent setting situations respectively corresponding to different scenario attributes according to actual road survey result or according to experience, for example, classes of agents under the scenario attribute and number of agents under each class.

After classes of agents corresponding to the user-set scenario attribute and the number of agents under each class are determined, corresponding classes and corresponding number of agents may be selected from the alternative agent repository according to the determination result.

It is appreciated that the aforesaid manner of determining the map and agent matching with the user-set scenario attribute is only intended for exemplary illustration. In practical application, any manner that may be envisioned by those skilled in the art may be employed and is not limited to the aforesaid manner.

In step 13, generate a test scenario according to the determined map and agent.

After a map and agent matching with the user-set scenario attribute are determined respectively in step 12, a test scenario may be generated according to the determined map and agent.

When the number of the determined maps is one, the determined map may be directly fused with the determined agent to obtain a desired test scenario.

When the number of the determined maps is greater than one, each determined map may be fused with the determined agent to obtain a fused scenario, and then a fused scenario best matching with the user-set scenario attribute may be selected from fused scenarios as the desired test scenario.

For example, the number of the determined maps is three, three fused scenarios may be obtained, a fused scenario best matching with the user-set scenario attribute may be selected from three fused scenarios as the test scenario.

How to fuse the maps with the agents and how to determine the fitting degree between the fused scenario and the user-set scenario attribute belong to the prior art.

In addition, if the user is not satisfied with a certain aspect of the resultant test scenario or feels it unreasonable, he may adjust manually, and correspondingly, receive and store the user's adjustment of the test scenario. How to make adjustment is also of the prior art.

Subsequently, the unmanned vehicle may be tested using the obtained test scenario.

The method embodiment of the present invention is described above. The solution of the present invention is further described through the following apparatus embodiment.

Embodiment 2

Figure 2:
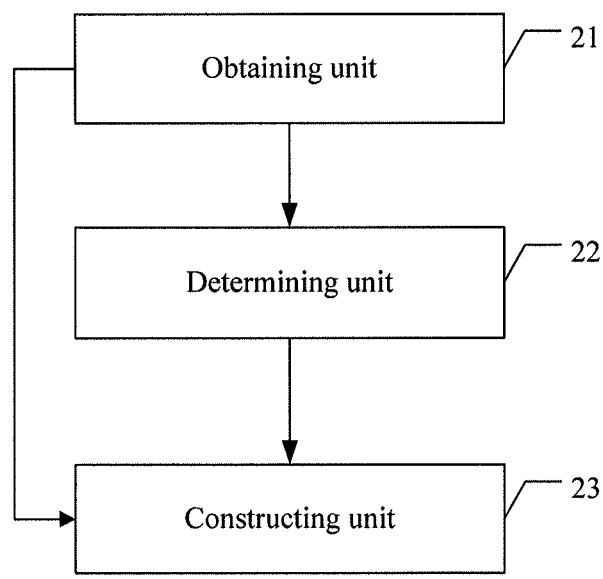
FIG. 2 is a structural schematic view of components of an embodiment of an apparatus of constructing a test scenario of an unmanned vehicle according to the present invention.

FIG. 2 is a structural schematic view of components of an embodiment of an apparatus of constructing a test scenario of an unmanned vehicle according to the present invention. As shown in FIG. 2, the apparatus comprises: an obtaining unit 21, a determining unit 22 and a constructing unit 23.

The obtaining unit 21 is configured to obtain a user-set scenario attribute, and transmit the user-set scenario attribute to the determining unit 22;

The determining unit 22 is configured to respectively determine a map and agent matching with the user-set scenario attribute, and transmit the determined map and agent to the constructing unit 23;

The constructing unit 23 is configured to generate a test scenario according to the determined map and agent.

The user-set scenario attribute may comprise road style, congestion degree, agent behavior attribute and the like, wherein road style may refer to road type such as urban road or super highway, number and width of lanes and the like. The agent behavior attribute may refer to normal walk, traversing or the like. Specific content included in the scenario attribute may be determined according to actual needs.

After obtaining the user-set scenario attribute, the obtaining unit 21 is further configured to obtain an alternative map repository and an alternative agent repository, and transmit the obtained alternative map repository and alternative agent repository to the determining unit 22; the determining unit 22 is configured to determine from the alternative map repository a map matching with the user-set scenario attribute, and determine from the alternative agent repository an agent matching with the user-set scenario attribute.

In practical application, it is feasible to pre-store in one map management repository all maps that may be used for generating test scenarios. How to generate maps in the map management repository is of the prior art. It is feasible to pre-store in one agent management repository all agents that might be used for generating test scenarios. How to generate agents in the agent management repository is also of the prior art.

Maps stored in the map management repository all are high-precision maps. As compared with ordinary maps, high-precision maps have richer map information such as lane lines, lane boundary, zebra crossing, stop lines, traffic lights, traffic signs and the likes.

The agent has its own trigger condition and disappearance condition, meanwhile has a specific traffic behavior and can be perfectly fused with the high-precision map.

The map management repository may support addition, deletion, lookup and modification of maps therein, and the agent management repository may support addition, deletion, lookup, and modification of agents therein.

All maps in the map management repository may be regarded as alternative maps to form the alternative map repository. All agents in the agent management repository may be regarded as alternative agents to form the alternative agent repository.

Alternatively, to reduce the workload in subsequent processing, maps screened out from the map management repository and related to the user-set scenario attribute may be regarded as alternative maps to form the alternative map repository, and agents screened out from the agent management repository and related to the user-set scenario attribute may be regarded as alternative agents to form the alternative agent repository.

Maps in the map management repository have their respective tags. The tags may include style tags and attribute tags. The style tags may employ a hierarchical representation manner such as urban road-straight road crossing. The attribute tags are used to describe map attributes, such as the number and width of lanes. Similarly, agents in the agent management repository have their respective tags. The tags include style tags such as pedestrian-normal walk and attribute tags and the like.

As for each alternative map in the alternative map repository, the determining unit 22 is configured to determine a fitting degree between the alternative map and the user-set scenario attribute according to the tag of the alternative map, and regard N alternative maps with a maximum fitting degree as maps matching with the user-set scenario attributes.

The aforesaid N is a positive integer. A specific value thereof may be decided according to actual needs, for example, it may be one or greater than one.

Regarding the alternative map repository, the determining unit 22 is configured to determine classes of agents corresponding to the user-set scenario attribute and the number of agents under each class according to agent setting situations respectively corresponding to different pre-set scenario attributes, and select agents from the alternative agent repository according to the determined classes of agents and the number of agents under each class.

The determining unit 22 is configured to transmit the determined map and agent to the constructing unit 23.

The obtaining unit 21 may be further configured to transmit the user-set scenario attribute to the constructing unit 23.

As such, when the number of the determined maps is one, the constructing unit 23 may directly fuse the determined map with the determined agent to obtain a desired test scenario.

When the number of the determined maps is greater than one, the constructing unit 23 is configured to fuse each determined map with the determined agent to obtain a fused scenario, and then regard a fused scenario best matching with the user-set scenario attribute as the desired test scenario.

In addition, if the user is not satisfied with a certain aspect of the resultant test scenario or feels it unreasonable, he may adjust manually, and correspondingly, the constructing unit 23 receives and stores the user's adjustment of the test scenario. How to make adjustment is also of the prior art.

Subsequently, the unmanned vehicle may be tested using the obtained test scenario.

To conclude, with the solution of the present invention being employed, the map and agent matching with the scenario attribute may be automatically screened according to the user-set scenario attribute and thereby the test scenario is generated. As compared with the prior art, the solution of the present invention improves the construction efficiency of the test scenario and thereby shortens a test cycle of the unmanned vehicle.

In the embodiments provided by the present invention, it should be understood that the revealed apparatus and method can be implemented through other ways. For example, the embodiments for the apparatus are only exemplary, e.g., the division of the units is merely logical one, and, in reality, they can be divided in other ways upon implementation.

The units described as separate parts may be or may not be physically separated, the parts shown as units may be or may not be physical units, i.e., they can be located in one place, or distributed in a plurality of network units. One can select some or all the units to achieve the purpose of the embodiment according to the actual needs.

Further, in the embodiments of the present invention, functional units can be integrated in one processing unit, or they can be separate physical presences; or two or more units can be integrated in one unit. The integrated unit described above can be realized in the form of hardware, or they can be realized with hardware and software functional units.

The aforementioned integrated unit in the form of software function units may be stored in a computer readable storage medium. The aforementioned software function units are stored in a storage medium, including several instructions to instruct a computer device (a personal computer, server, or network equipment, etc.) or processor to perform some steps of the method described in the various embodiments of the present invention. The aforementioned storage medium includes various media that may store program codes, such as U disk, removable hard disk, read-only memory (ROM), a random access memory (RAM), magnetic disk, or an optical disk.

The foregoing is only preferred embodiments of the present invention, not intended to limit the invention. Any modifications, equivalent replacements, improvements and the like made within the spirit and principles of the present invention, should all be included in the present invention within the scope of protection.

What is claimed is:

1. A computer implemented method for constructing a test scenario of an unmanned vehicle, wherein the method comprises:

obtaining a scenario attribute set by a user, the scenario attribute comprising road style attribute, congestion degree attribute or agent behavior attribute;

respectively determining a map and an agent matching with the scenario attribute, the agent having its own trigger condition and disappearance condition, and having a specific traffic behavior;

generating a test scenario for simulating real traffic scenario, according to the determined map and agent, wherein, before respectively determining a map and an agent matching with the scenario attribute, the method further comprises: obtaining an alternative map repository and an alternative agent repository;

the respectively determining a map and an agent matching with the scenario attribute comprises:

determining from the alternative map repository a map matching with the scenario attribute; and determining from the alternative agent repository an agent matching with the scenario attribute, and wherein, the generating a test scenario according to the determined map and agent comprises:

when the number of the determined maps is one, fusing the determined map with the determined agent to obtain the test scenario;

when the number of the determined maps is greater than one, fusing each determined map with the determined agent to obtain a fused scenario, and then regarding a fused scenario best matching with the scenario attribute as the test scenario.

2. The method according to claim 1, wherein, the obtaining an alternative map repository and an alternative agent repository comprises:

regarding all maps in the pre-generated map management repository as alternative maps to form the alternative map repository;

regarding all agents in the pre-generated agent management repository as alternative agents to form the alternative agent repository;

or, regarding maps screened out from the map management repository and related to the scenario attribute as alternative maps to form the alternative map repository;

regarding agents screened out from the agent management repository and related to the scenario attribute as alternative agents to form the alternative agent repository.

3. The method according to claim 1, wherein, the determining from the alternative map repository a map matching with the scenario attribute comprises:

respectively determining a fitting degree between the alternative map in the alternative map repository and the scenario attribute, and regarding N alternative maps with a maximum fitting degree as maps matching with the scenario attributes, N being a positive integer.

4. The method according to claim 1, wherein, the determining from the alternative map repository a map matching with the scenario attribute comprises:

respectively determining a fitting degree between the alternative map in the alternative map repository and the scenario attribute, and regarding N alternative maps with a maximum fitting degree as maps matching with the scenario attributes, N being a positive integer.

5. The method according to claim 1, wherein, the determining from the alternative agent repository an agent matching with the scenario attribute comprises:

determining classes of agents corresponding to the scenario attribute and the number of agents under each class according to agent setting situations respectively corresponding to different pre-set scenario attributes, and selecting agents from the alternative agent repository according to the determined classes of agents and the number of agents under each class.

6. The method according to claim 1, wherein, the determining from the alternative agent repository an agent matching with the scenario attribute comprises:

determining classes of agents corresponding to the scenario attribute and the number of agents under each class according to agent setting situations respectively corresponding to different pre-set scenario attributes, and selecting agents from the alternative agent repository according to the determined classes of agents and the number of agents under each class.

7. The method according to claim 1, wherein, the method further comprises:

receiving and storing the user's adjustment of the test scenario.

8. An apparatus of constructing a test scenario of an unmanned vehicle comprises:

at least one processor; and a memory storing instructions, which when executed by the at least one processor, cause the at least one processor to perform operations, the operations comprising:

obtaining a scenario attribute set by a user;

respectively determining a map and an agent matching with the scenario attribute, the agent having its own trigger condition and disappearance condition, and having a specific traffic behavior;

generating a test scenario for simulating real traffic scenario, according to the determined map and agent, wherein, before respectively determining a map and an agent matching with the scenario attribute, the operations further comprise: obtaining, an alternative map repository and an alternative agent repository;

the operation of respectively determining a map and an agent matching with the scenario attribute comprises:

determining from the alternative map repository a map matching with the scenario attribute; and determining from the alternative agent repository an agent matching with the scenario attribute, and wherein, the generating a test scenario according to the determined map and agent comprises:

when the number of the determined maps is one, fusing the determined map with the determined agent to obtain the test scenario;

when the number of the determined maps is greater than one, fusing each determined map with the determined agent to obtain a fused scenario, and then regarding a fused scenario best matching with the scenario attribute as the test scenario.

9. The apparatus according to claim 8, wherein, the operation of obtaining an alternative map repository and an alternative agent repository comprises:

regarding all maps in the pre-generated map management repository as alternative maps to form the alternative map repository;

regarding all agents in the pre-generated agent management repository as alternative agents to form the alternative agent repository;

or, regarding maps screened out from the map management repository and related to the scenario attribute as alternative maps to form the alternative map repository;

regarding agents screened out from the agent management repository and related to the scenario attribute as alternative agents to form the alternative agent repository.

10. The apparatus according to claim 8, wherein, the operation of determining from the alternative map repository a map matching with the scenario attribute comprises:

respectively determining a fitting degree between the alternative map in the alternative map repository and the scenario attribute, and regarding N alternative maps with a maximum fitting degree as maps matching with the scenario attributes, N being a positive integer.

11. The apparatus according to claim 8, wherein, the operation of determining from the alternative map repository a map matching with the scenario attribute comprises:

respectively determining a fitting degree between the alternative map in the alternative map repository and the scenario attribute, and regarding N alternative maps with a maximum fitting degree as maps matching with the scenario attributes, N being a positive integer.

12. The apparatus according to claim 8, wherein, the operation of determining from the alternative agent repository an agent matching with the scenario attribute comprises:

determining classes of agents corresponding to the scenario attribute and the number of agents under each class according to agent setting situations respectively corresponding to different pre-set scenario attributes, and selecting agents from the alternative agent repository according to the determined classes of agents and the number of agents under each class.

13. The apparatus according to claim 8, wherein, the operation of determining from the alternative agent repository an agent matching with the scenario attribute comprises:

determining classes of agents corresponding to the scenario attribute and the number of agents under each class according to agent setting situations respectively corresponding to different pre-set scenario attributes, and selecting agents from the alternative agent repository according to the determined classes of agents and the number of agents under each class.

14. The apparatus according to claim 8, wherein, the operations further comprise:

receiving and storing the user's adjustment of the test scenario.

15. A computer storage medium, wherein the computer storage medium is coded with a computer program, and when the program is executed by one or more computers, the one or more computers perform the following operations:

obtaining a scenario attribute set by a user;

respectively determining a map and an agent matching with the scenario attribute, the agent having its own trigger condition and disappearance condition, and having a specific traffic behavior;

generating a test scenario for simulating real traffic scenario, according to the determined map and agent, wherein, before respectively determining a map and an agent matching with the scenario attribute, the operations further comprise: obtaining an alternative map repository and an alternative agent repository;

the operation of respectively determining a map and an agent matching with the scenario attribute comprises:

determining from the alternative map repository a map matching with the scenario attribute; and determining from the alternative agent repository an agent matching with the scenario attribute, and wherein, the generating a test scenario according to the determined map and agent comprises:

when the number of the determined maps is one, fusing the determined map with the determined agent to obtain the test scenario;

when the number of the determined maps is greater than one, fusing each determined map with the determined agent to obtain a fused scenario, and then regarding a fused scenario best matching with the scenario attribute as the test scenario.

* * * * *